United States Patent
Zhou et al.

(10) Patent No.: US 10,120,246 B2
(45) Date of Patent: Nov. 6, 2018

(54) MANUFACTURING METHOD OF IPS ARRAY SUBSTRATE AND IPS ARRAY SUBSTRATE

(71) Applicant: Shenzhen China Star Optoelectronics Technology Co., Ltd., Shenzhen (CN)

(72) Inventors: Zhichao Zhou, Shenzhen (CN); Hui Xia, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 110 days.

(21) Appl. No.: 15/328,495

(22) PCT Filed: Dec. 15, 2016

(86) PCT No.: PCT/CN2016/110070
§ 371 (c)(1),
(2) Date: Jan. 24, 2017

(87) PCT Pub. No.: WO2018/036027
PCT Pub. Date: Mar. 1, 2018

(65) Prior Publication Data
US 2018/0217454 A1     Aug. 2, 2018

(30) Foreign Application Priority Data
Aug. 23, 2016 (CN) .......................... 2016 1 0711928

(51) Int. Cl.
*H01L 21/00* (2006.01)
*G02F 1/1343* (2006.01)
(Continued)

(52) U.S. Cl.
CPC ...... *G02F 1/134363* (2013.01); *G02F 1/1343* (2013.01); *G02F 1/1368* (2013.01);
(Continued)

(58) Field of Classification Search
CPC .................. H01L 27/1288; H01L 21/77; G02F 2201/123
See application file for complete search history.

(56) References Cited

U.S. PATENT DOCUMENTS 7,071,036 B2 * 7/2006 Yang .................... H01L 27/1255
257/E27.111
7,636,135 B2 * 12/2009 Wang .................. H01L 27/1288
349/43
(Continued)

FOREIGN PATENT DOCUMENTS

CN     202735644 U     2/2013

*Primary Examiner* — Laura M Menz
(74) *Attorney, Agent, or Firm* — Leong C. Lei (57) ABSTRACT

The present invention provides a manufacturing method of an IPS array substrate and an IPS array substrate. The manufacturing method of the IPS array substrate according to the present invention uses a half-tone mask to simultaneously form a common electrode and a pixel electrode that stagger in a longitudinal direction so that the common electrode is set inside a common electrode channel of an insulation protection layer while the pixel electrode is set on an upper surface of the insulation protection layer to provide an IPS array substrate, which, compared to a traditional IPS array substrate, allows the common electrode and the pixel electrode to generate therebetween a longitudinal component of an electric field whereby liquid crystal of a liquid crystal panel that is located above the pixel electrode can be driven and used, where the liquid crystal is allowed to rotate horizontally and also allowed to generate a predetermined longitudinal tilt angle the TFT substrate can be a TFT substrate provided for a traditional IPS array substrate, making it possible to save one mask and associated process, as compared to a traditional FFS array substrate, and thus saving manufacturing cost.

6 Claims, 4 Drawing Sheets

(51) Int. Cl.
  *H01L 21/77* (2017.01)
  *H01L 27/12* (2006.01)
  *G02F 1/1333* (2006.01)
  *G02F 1/1335* (2006.01)
  *G02F 1/1362* (2006.01)
  *G02F 1/1368* (2006.01)

(52) U.S. Cl.
  CPC .. *G02F 1/133345* (2013.01); *G02F 1/133512* (2013.01); *G02F 1/133514* (2013.01); *G02F 1/136286* (2013.01); *H01L 21/77* (2013.01); *H01L 27/12* (2013.01); *H01L 27/124* (2013.01); *H01L 27/1288* (2013.01); *G02F 2201/121* (2013.01); *G02F 2201/123* (2013.01)

(56) References Cited

U.S. PATENT DOCUMENTS

| | | | | |
|---|---|---|---|---|
| 8,071,887 B2 * | 12/2011 | Liou | ............. | H05K 1/097 174/256 |
| 8,516,694 B2 * | 8/2013 | Cai | ............. | H05K 3/4697 29/829 |
| 8,518,729 B1 * | 8/2013 | Dai | ............. | H01L 29/78633 257/E21.062 |
| 9,142,653 B2 * | 9/2015 | Wang | ............. | H01L 29/24 |
| 9,520,421 B1 * | 12/2016 | Li | ............. | H01L 27/1281 |
| 9,553,198 B1 * | 1/2017 | Lv | ............. | H01L 29/78669 |
| 9,570,618 B1 * | 2/2017 | Lu | ............. | H01L 29/78618 |
| 9,666,653 B2 * | 5/2017 | Li | ............. | H01L 21/77 |
| 9,761,617 B2 * | 9/2017 | Liu | ............. | H01L 27/1288 |
| 9,786,696 B2 * | 10/2017 | Wang | ............. | H01L 21/77 |
| 9,876,037 B2 * | 1/2018 | Lv | ............. | H01L 21/77 |
| 9,876,040 B1 * | 1/2018 | Zhang | ............. | H01L 27/1274 |
| 9,899,221 B2 * | 2/2018 | Zhou | ............. | G02F 1/1343 |
| 9,923,002 B2 * | 3/2018 | Li | ............. | H01L 21/77 |
| 2004/0048407 A1 * | 3/2004 | Lee | ............. | H01L 27/1255 438/30 |
| 2006/0091397 A1 * | 5/2006 | Akimoto | ............. | H01L 27/3244 257/72 |

* cited by examiner

MANUFACTURING METHOD OF IPS ARRAY SUBSTRATE AND IPS ARRAY SUBSTRATE

BACKGROUND OF THE INVENTION

1. Field of the Invention

The present invention relates to the field of display technology, and more particular to a manufacturing method of an in-plane switching (IPS) array substrate and an in-plane switching (IPS) array substrate.

2. The Related Arts

With the progress of the display technology, flat panel display devices, such as thin film transistor liquid crystal display (TFT-LCD), due to various advantages, such as high image quality, low power consumption, thin device body, and wide range of applications, have been widely used in various consumer electronic products, including mobile phones, televisions, personal digital assistants, digital cameras, notebook computers, and desktop computers, making them the main stream of display devices.

Most of the liquid crystal display devices that are currently available in the market are backlighting LCDs, which comprise a liquid crystal display panel and a backlight module. The working principle of the liquid crystal display panel is that, with liquid crystal molecules disposed between two parallel glass substrates and multiple vertical and horizontal tiny conductive wires arranged between the two glass substrates, electricity is applied to control change of direction of the liquid crystal molecules for refracting out light emitting from the backlight module to generate an image. The liquid crystal display panel is generally made up of a color filter (CF) substrate, an array substrate, liquid crystal (LC) interposed between the CF substrate and the array substrate, and sealant and is generally manufactured with a process involving an anterior stage of array engineering (for thin film, photolithography, etching, and film peeling), an intermediate stage of cell engineering (for lamination of the array substrate and the CF substrate), and a posterior stage of module assembly (for combining a drive integrated circuit (IC) and a printed circuit board). Among these stages, the anterior stage of array engineering generally involves the formation the array substrate for controlling the movement of liquid crystal molecules; the intermediate stage of cell engineering generally involves filling liquid crystal between the array substrate and the CF substrate; and the posterior stage of module assembly generally involves the combination of the drive IC and the printed circuit board for driving the liquid crystal molecules to rotate for displaying images. The array substrate of the TFT-LCD is provided thereon with a plurality of scan lines, a plurality of data lines, and a plurality of common electrode wires. The plurality of scan lines and the plurality of data lines collectively define a plurality of pixel units. Each of the pixel unit is provided therein with a thin film transistor and a pixel electrode. A gate terminal of the thin film transistor is connected to a corresponding gate line. When an electrical voltage of the gate line reaches a conducting-on voltage, a source terminal and a drain terminal of the thin film transistor are conducted on to allow a data voltage to feed to the pixel electrode.

Based on drive modes, the TFT-LCDs available in the mainstream market can be classified in three categories, which are twisted nematic (TN) or supper twisted nematic (STN) mode, in-plane switching (IPS) mode, and vertical alignment (VA) mode, among which the IPS mode is a mode that applies an electric field that is substantially parallel to a substrate surface to drive liquid crystal molecules to rotate in the substrate surface for response and is widely attended and used due to exhibiting excellent view angle characteristic and pressing-down characteristic.

However, the known IPS array substrate adopts a design that arranges the pixel electrode and the common electrode on the same plane in order to form a parallel electric field and as a consequence, liquid crystal that is located above the electrode in a longitudinal direction cannot be effectively used. To improve the utilization efficiency of the liquid crystal above the electrode, a fringe field switching (FFS) mode is developed on the basis of the IPS mode. Although a display panel of this mode provides increased liquid crystal utilization efficiency, transmission rate, and contrast, the manufacturing process requires an increased number of mask, thereby increasing the manufacturing cost.

SUMMARY OF THE INVENTION

Objectives of the present invention are to provide a manufacturing method of an in-plane switching (IPS) array substrate, which uses a half-tone mask to form a common electrode that is located in an insulation protection layer and a pixel electrode that is located on an upper surface of the insulation protection layer so that a longitudinal component of an electric field may be generated between the common electrode and the pixel electrode and the manufacturing process is simple.

Objectives of the present invention are also to provide an IPS array substrate, in which a common electrode is arranged in a common electrode channel of an insulation protection layer and a pixel electrode is arranged on an upper surface of the insulation protection layer so that a longitudinal component of an electric field may be generated between the common electrode and the pixel electrode and the manufacturing process is simple.

To achieve the above objectives, the present invention provides a manufacturing method of an IPS array substrate, which comprises the following steps:

Step 1: providing a thin film transistor (TFT) substrate and depositing an insulation protection layer on the TFT substrate;

Step 2: coating a layer of photoresist material on the insulation protection layer and subjecting the layer of photoresist material to exposure and development by using a half-tone mask so as to form a photoresist layer, wherein the photoresist layer comprises a first channel that completely penetrates through the photoresist layer to expose a part of the insulation protection layer and a second channel that does not penetrate through the photoresist layer and covers on the insulation protection layer;

Step 3: subjecting the insulation protection layer to etching with the photoresist layer as a shielding layer so as to form a common electrode channel in the insulation protection layer to corresponds to the first channel;

Step 4: subjecting the photoresist layer to ashing treatment in order to thin the photoresist layer and allow the second channel to penetrate through the photoresist layer to expose a part of the insulation protection layer; and Step 5: depositing a conductive layer on the remaining portion of the photoresist layer and the insulation protection layer and peeling off the photoresist layer to remove the photoresist layer and a portion of the conductive layer located on the photoresist layer, with a portion of the conductive layer located in the common electrode channel and corresponding to the first channel preserved to form a common electrode and a portion of the conductive layer located on an upper surface of the insulation protection layer and corresponding to the second channel also preserved to form a pixel electrode.

In Step 3, the insulation protection layer is subjected to dry etching and an etchant gas used comprises a mixture gas of $CF_4$, $O_2$, $Cl_2$, and He.

In Step 2, the photoresist material coated on the insulation protection layer comprises a positive resist material, and the half-tone mask comprises a light transmission zone, a partial light transmission zone, and a remaining portion that is a light shielding zone, wherein the first channel corresponds to and is formed with the light transmission zone and the second channel corresponds to and is formed with the partial light transmission zone.

In Step 1, depositing the insulation protection layer is achieved with chemical vapor deposition and the insulation protection layer comprises a material that comprises silicon nitride, silicon oxide, or a stacked combination of silicon nitride and silicon oxide.

In Step 5, depositing the conductive layer is achieved with physical vapor deposition and the conductive layer comprises a metal material or a transparent metal oxide material.

The TFT substrate provided in Step 1 comprises a backing plate, a plurality of gate scan lines and a plurality of data lines formed on the backing plate, and a plurality of pixel units that are arranged in an array and defined by the plurality of gate scan lines and the plurality of data lines crossing each other in a mutually isolated manner;

wherein each of the pixel units comprises a TFT device.

The present invention also provides an IPS array substrate, which comprises a TFT substrate, an insulation protection layer, a common electrode, and a pixel electrode;

wherein the insulation protection layer is formed on the TFT substrate and the insulation protection layer comprises a common electrode channel; the common electrode is formed in the common electrode channel; and the pixel electrode is formed on an upper surface of the insulation protection layer.

The insulation protection layer comprises a material that comprises silicon nitride, silicon oxide, or a stacked combination of silicon nitride and silicon oxide.

The common electrode and the pixel electrode each comprise a metal material or a transparent metal oxide material.

The TFT substrate comprises a backing plate, a plurality of gate scan lines and a plurality of data lines formed on the backing plate, and a plurality of pixel units that are arranged in an array and defined by the plurality of gate scan lines and the plurality of data lines crossing each other in a mutually isolated manner;

wherein each of the pixel units comprises a TFT device.

The present invention further provides a manufacturing method of an IPS array substrate, which comprises the following steps:

Step 1: providing a TFT substrate and depositing an insulation protection layer on the TFT substrate;

Step 2: coating a layer of photoresist material on the insulation protection layer and subjecting the layer of photoresist material to exposure and development by using a half-tone mask so as to form a photoresist layer, wherein the photoresist layer comprises a first channel that completely penetrates through the photoresist layer to expose a part of the insulation protection layer and a second channel that does not penetrate through the photoresist layer and covers on the insulation protection layer;

Step 3: subjecting the insulation protection layer to etching with the photoresist layer as a shielding layer so as to form a common electrode channel in the insulation protection layer to corresponds to the first channel;

Step 4: subjecting the photoresist layer to ashing treatment in order to thin the photoresist layer and allow the second channel to penetrate through the photoresist layer to expose a part of the insulation protection layer; and Step 5: depositing a conductive layer on the remaining portion of the photoresist layer and the insulation protection layer and peeling off the photoresist layer to remove the photoresist layer and a portion of the conductive layer located on the photoresist layer, with a portion of the conductive layer located in the common electrode channel and corresponding to the first channel preserved to form a common electrode and a portion of the conductive layer located on an upper surface of the insulation protection layer and corresponding to the second channel also preserved to form a pixel electrode;

wherein in Step 3, the insulation protection layer is subjected to dry etching and an etchant gas used comprises a mixture gas of $CF_4$, $O_2$, $Cl_2$, and He;

wherein in Step 1, depositing the insulation protection layer is achieved with chemical vapor deposition and the insulation protection layer comprises a material that comprises silicon nitride, silicon oxide, or a stacked combination of silicon nitride and silicon oxide.

The efficacy of the present invention is that the present invention provides a manufacturing method of an IPS array substrate that uses a half-tone mask to simultaneously form a common electrode and a pixel electrode that stagger in a longitudinal direction so that the common electrode is set inside a common electrode channel of an insulation protection layer while the pixel electrode is set on an upper surface of the insulation protection layer to provide an IPS array substrate, which, compared to a traditional IPS array substrate, allows the common electrode and the pixel electrode to generate therebetween a longitudinal component of an electric field whereby liquid crystal of a liquid crystal panel that is located above the pixel electrode can be driven and used, where the liquid crystal is allowed to rotate horizontally and also allowed to generate a predetermined longitudinal tilt angle the TFT substrate can be a TFT substrate provided for a traditional IPS array substrate, making it possible to save one mask and associated process, as compared to a traditional FFS array substrate, and thus saving manufacturing cost. The present invention provides an IPS array substrate, which comprises a common electrode located inside a common electrode channel of an insulation protection layer and a pixel electrode located on an upper surface of the insulation protection layer so as to make the common electrode and the pixel electrode stagger with respect to each other in the longitudinal direction, allowing the common electrode and the pixel electrode to generate therebetween a longitudinal component of an electric field so as to improve liquid crystal utilization efficiency and light transmission rate, while the manufacturing process is simple.

BRIEF DESCRIPTION OF THE DRAWINGS

For better understanding of the features and technical contents of the present invention, reference will be made to the following detailed description of the present invention and the attached drawings. However, the drawings are provided only for reference and illustration and are not intended to limit the present invention.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
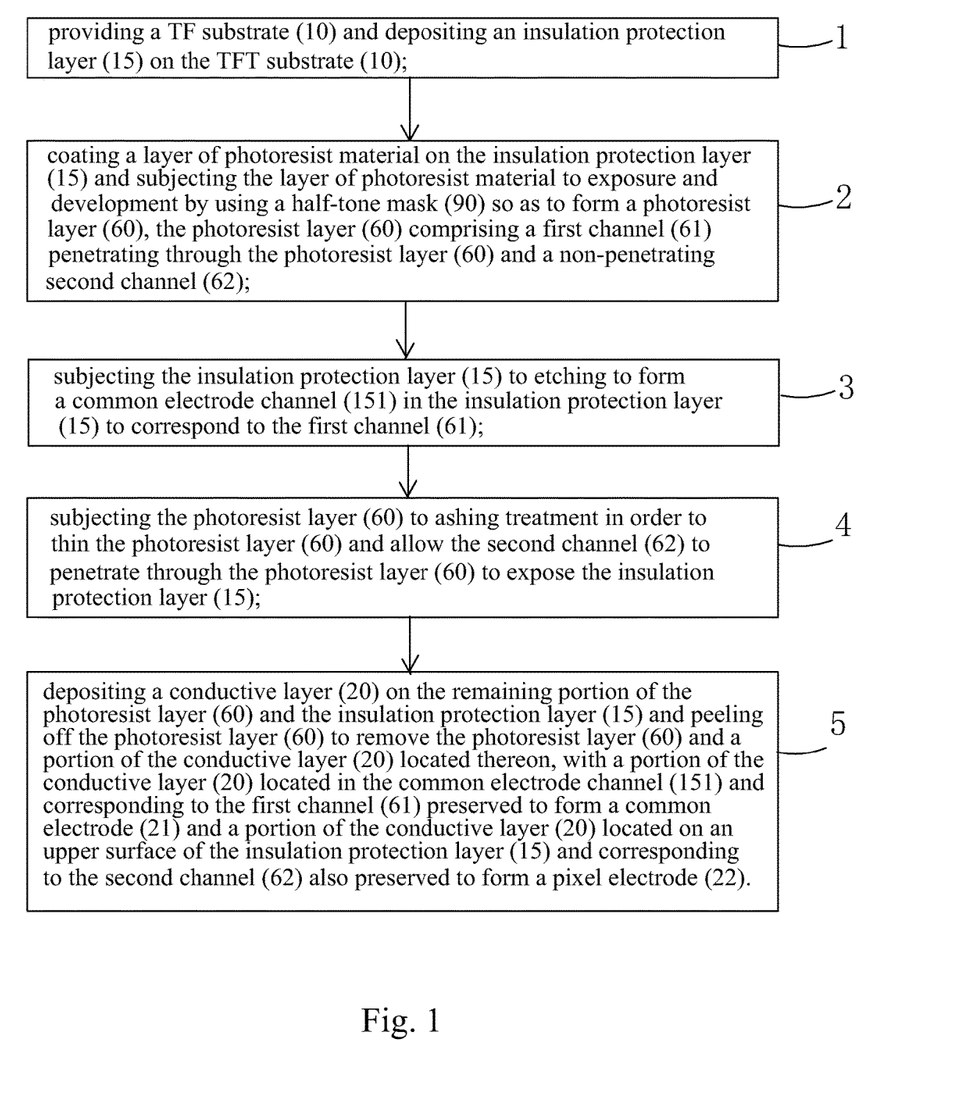
FIG. 1 is a flow chart illustrating a manufacturing method of an in-plane switching (IPS) array substrate according to the present invention.
Figure 2:
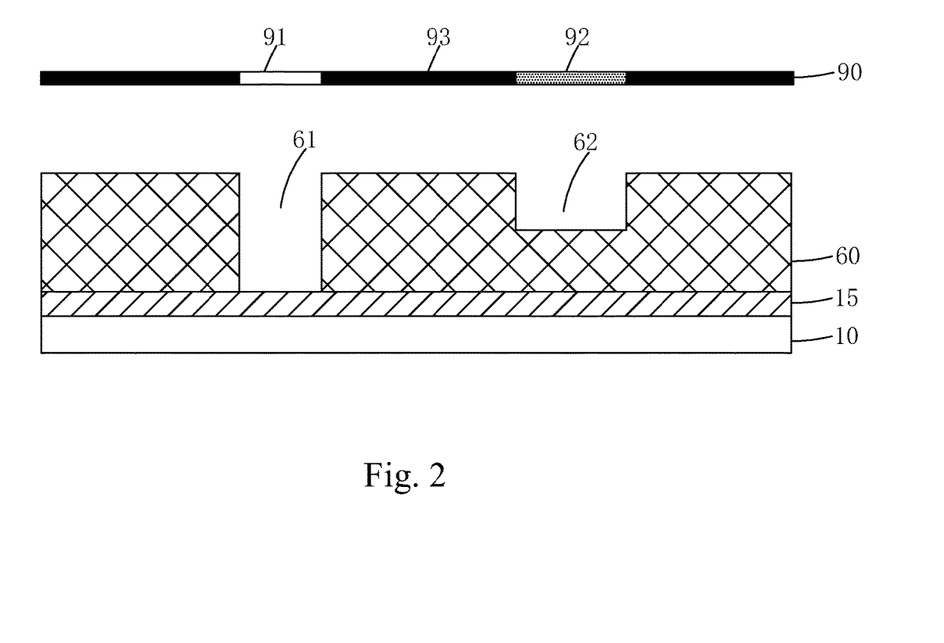
FIG. 2 is a schematic view illustrating Step 2 of the manufacturing method of the IPS array substrate according to the present invention.

Referring to FIG. 1, in combination with FIGS. 2-6, the present invention provides a manufacturing method of an in-plane switching (IPS) array substrate, which comprises the following steps:

Step 1: as shown in FIG. 2, providing a thin film transistor (TFT) substrate 10 and depositing an insulation protection layer 15 on the TFT substrate 10.

Specifically, in Step 1, chemical vapor deposition (CVD) is used to deposit the insulation protection layer 15, and the insulation protection layer 15 comprises a material that comprises silicon nitride, silicon oxide, or a stacked combination of silicon nitride and silicon oxide.

Preferably, the insulation protection layer 15 comprises a material that comprises silicon nitride.

Specifically, the TFT substrate 10 can be a TFT substrate provided for a traditional IPS array substrate of which a manufacturing process is a known technique so that description will be omitted, wherein the TFT substrate 10 comprises a backing plate, a plurality of gate scan lines and a plurality of data lines formed on the backing plate, and a plurality of pixel units that are arranged in an array and defined by the plurality of gate scan lines and the plurality of data lines crossing each other in a mutually isolated manner. Each of the pixel units comprises a TFT device, wherein description of a specific structure of the TFT device will be omitted.

Step 2: as shown in FIG. 2, coating a layer of photoresist material on the insulation protection layer 15 and subjecting the layer of photoresist material to exposure and development by using a half-tone mask 90 so as to form a photoresist layer 60, wherein the photoresist layer 60 comprises a first channel 61 that completely penetrates through the photoresist layer 60 to expose a part of the insulation protection layer 15 and a second channel 62 that does not penetrate through the photoresist layer 60 and covers on the insulation protection layer 15.

Specifically, in Step 2, the photoresist material coated on the insulation protection layer 15 comprises a positive resist material, and the half-tone mask 90 comprises a light transmission zone 91, a partial light transmission zone 92, and a remaining portion that is a light shielding zone 93, wherein the first channel 61 corresponds to and is formed with the light transmission zone 91 and the second channel 62 corresponds to and is formed with the partial light transmission zone 92.

Figure 3:
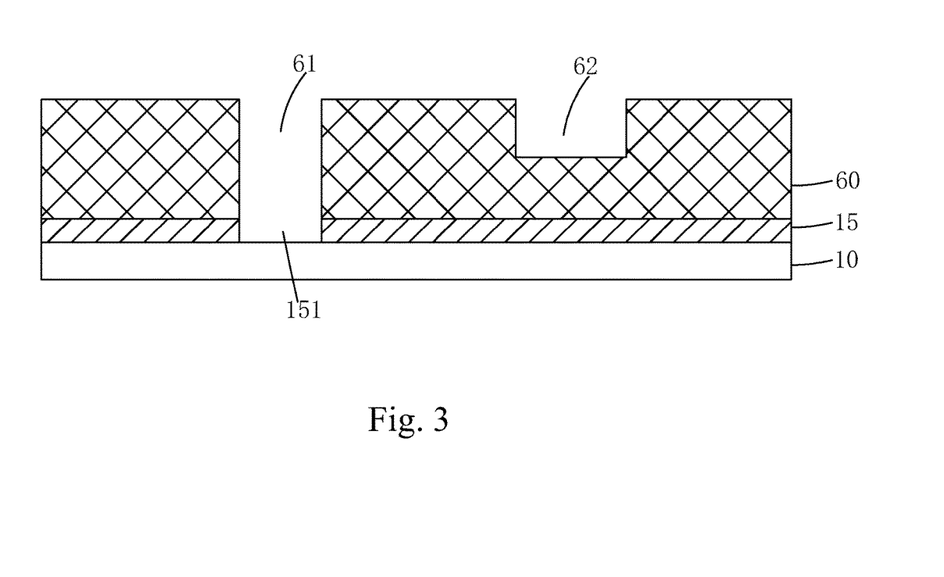
FIG. 3 is a schematic view illustrating Step 3 of the manufacturing method of the IPS array substrate according to the present invention.

Step 3: as shown in FIG. 3, subjecting the insulation protection layer 15 to etching with the photoresist layer 60 as a shielding layer so as to form a common electrode channel 151 in the insulation protection layer 15 to corresponds to the first channel 61.

Specifically, in Step 3, a mixture gas comprising carbon tetrafluoride ($CF_4$), oxygen ($O_2$), chlorine ($Cl_2$), and helium (He) is used to conduct dry etching of the insulation protection layer 15.

Figure 4:
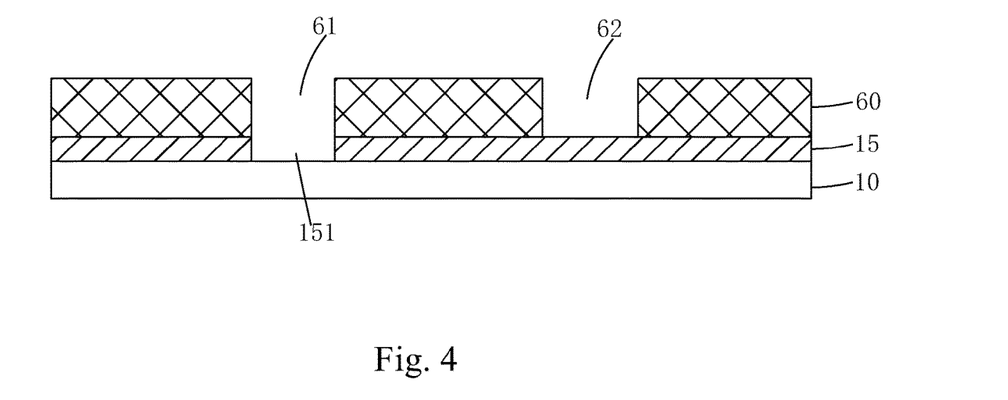
FIG. 4 is a schematic view illustrating Step 4 of the manufacturing method of the IPS array substrate according to the present invention.

Step 4: as shown in FIG. 4, subjecting the photoresist layer 60 to oxygen ashing treatment in order to thin the photoresist layer 60 and allow the second channel 62 to penetrate through the photoresist layer 60 to expose a part of the insulation protection layer 15.

Figure 5:
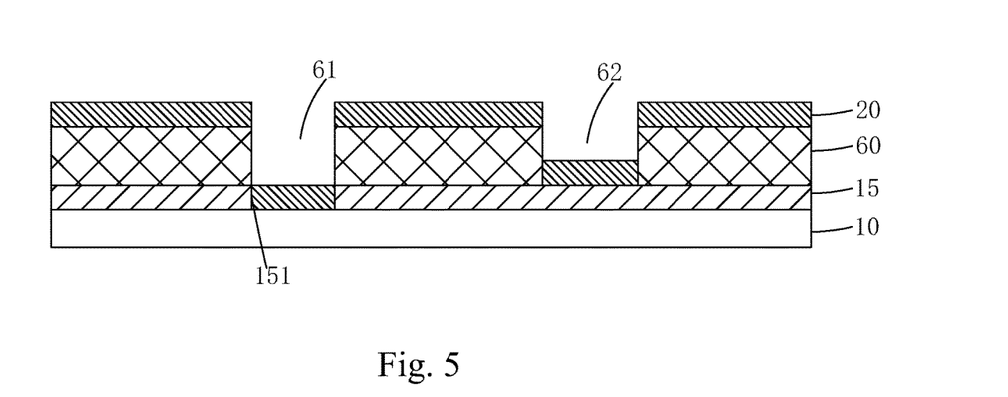
FIG. 5 is a schematic view illustrating deposition of a conductive layer in Step 5 of the manufacturing method of the IPS array substrate according to the present invention.
Figure 6:
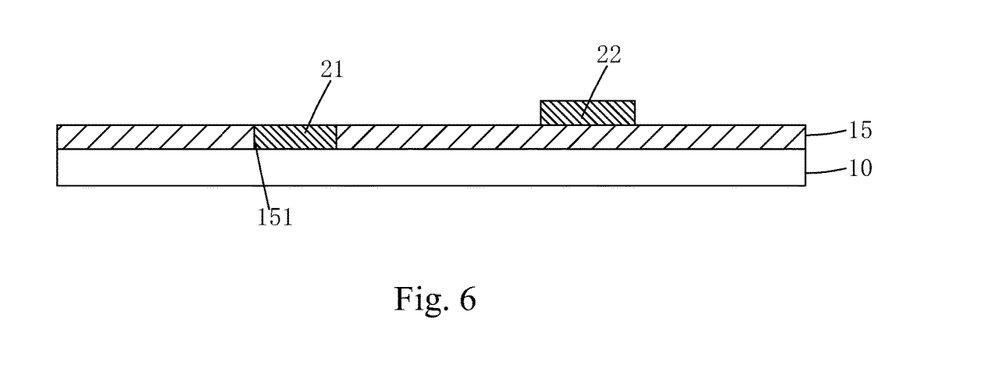
FIG. 6 is a schematic view illustrating formation of a common electrode and a pixel electrode in Step 5 of the manufacturing method of the IPS array substrate according to the present invention and is also a cross-sectional view illustrating the structure of the IPS array substrate according to the present invention.

Step 5: as shown in FIGS. 5-6, depositing a conductive layer 20 on the remaining portion of the photoresist layer 60 and the insulation protection layer 15 and peeling off the photoresist layer 60 to remove the photoresist layer 60 and a portion of the conductive layer 20 located thereon, with a portion of the conductive layer 20 located in the common electrode channel 151 and corresponding to the first channel 61 preserved to form a common electrode 21 and a portion of the conductive layer 20 located on an upper surface of the insulation protection layer 15 and corresponding to the second channel 62 also preserved to form a pixel electrode 22.

Specifically, in Step 5, physical vapor deposition (PVD) is used to deposit the conductive layer 20 and the conductive layer 20 may comprise a metal material, or may alternatively comprise a transparent metal oxide material, wherein the transparent metal oxide material may comprise one or multiple ones of indium tin oxide, indium zinc oxide, aluminum tin oxide, aluminum zinc oxide, and indium germanium zinc oxide.

Preferably, the conductive layer 20 comprises a material that comprises indium tin oxide.

The present invention provides a manufacturing method of an IPS array substrate that uses a half-tone mask 90 to simultaneously form a common electrode 21 and a pixel electrode 22 that stagger in a longitudinal direction so that the common electrode 21 is set inside a common electrode channel 151 of an insulation protection layer 15 while the pixel electrode 22 is set on an upper surface of the insulation protection layer 15 to provide an IPS array substrate, which, compared to a traditional IPS array substrate, allows the common electrode 21 and the pixel electrode 22 to generate therebetween a longitudinal component of an electric field whereby liquid crystal of a liquid crystal panel that is located above the pixel electrode 22 can be driven and used, where the liquid crystal is allowed to rotate horizontally and also allowed to generate a predetermined longitudinal tilt angle the TFT substrate 10 can be a TFT substrate provided for a traditional IPS array substrate, making it possible to save one mask and associated process, as compared to a traditional FFS array substrate, and thus saving manufacturing cost.

Figure 7:
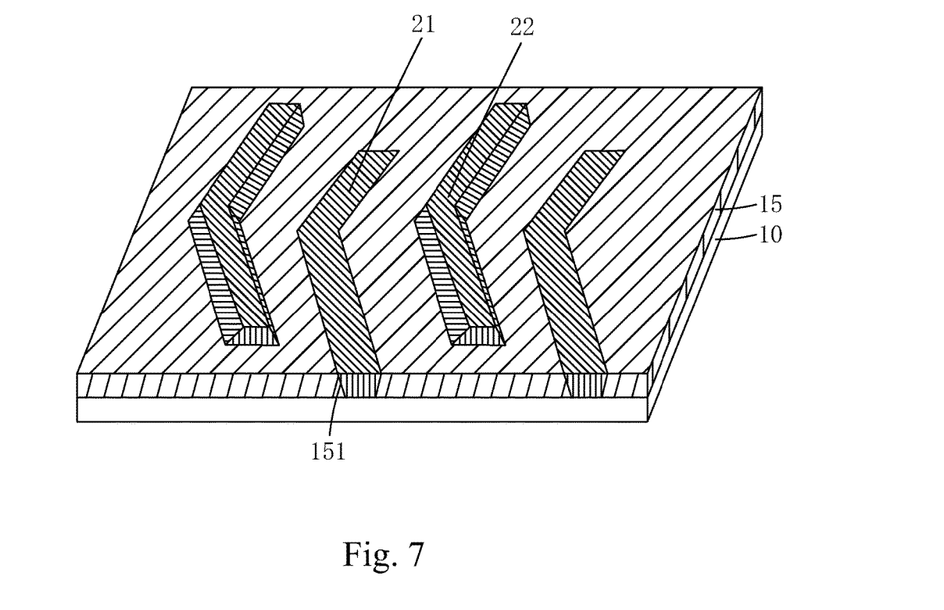
FIG. 7 is a schematic view illustrating the structure of the IPS array substrate according to the present invention.

Referring to FIGS. 6-7, based on the above-described manufacturing method of an IPS array substrate, the present invention also provides an IPS array substrate, which comprises a TFT substrate 10, an insulation protection layer 15, a common electrode 21, and a pixel electrode 22.

The insulation protection layer 15 is formed on the TFT substrate 10 and the insulation protection layer 15 comprises a common electrode channel 151. The common electrode 21 is formed in the common electrode channel 151. The pixel electrode 22 is formed on an upper surface of the insulation protection layer 15.

Specifically, the insulation protection layer 15 comprises a material that comprises silicon nitride, silicon oxide, or a stacked combination of silicon nitride and silicon oxide.

Preferably, the insulation protection layer 15 comprises a material that comprises silicon nitride.

Specifically, the common electrode 21 and the pixel electrode 22 are formed of a same conductive layer, of which a material comprises a metal material or, alternatively, a transparent metal oxide material, wherein the transparent metal oxide material comprises one or multiples ones of indium tin oxide, indium zinc oxide, aluminum tin oxide, aluminum zinc oxide, and indium germanium zinc oxide.

Preferably, the common electrode 21 and the pixel electrode 22 comprise a material that comprises indium tin oxide.

Specifically, the TFT substrate 10 comprises a backing plate, a plurality of gate scan lines and a plurality of data lines formed on the backing plate, and a plurality of pixel units that are arranged in an array and defined by the plurality of gate scan lines and the plurality of data lines crossing each other in a mutually isolated manner. Each of the pixel units comprises a TFT device. The TFT substrate 10 can be a TFT substrate provided for a traditional IPS array substrate, which is a known technique and a description of a specific structure of the TFT device provided thereon will be omitted.

The present invention provides an IPS array substrate, which comprises a common electrode 21 located inside a common electrode channel 151 of an insulation protection layer 15 and a pixel electrode 22 located on an upper surface of the insulation protection layer 15 so as to make the common electrode 21 and the pixel electrode 22 stagger with respect to each other in the longitudinal direction, allowing the common electrode 21 and the pixel electrode 22 to generate therebetween a longitudinal component of an electric field so as to improve liquid crystal utilization efficiency and light transmission rate, while the manufacturing process is simple.

In summary, the present invention provides a manufacturing method of an IPS array substrate that uses a half-tone mask to simultaneously form a common electrode and a pixel electrode that stagger in a longitudinal direction so that the common electrode is set inside a common electrode channel of an insulation protection layer while the pixel electrode is set on an upper surface of the insulation protection layer to provide an IPS array substrate, which, compared to a traditional IPS array substrate, allows the common electrode and the pixel electrode to generate therebetween a longitudinal component of an electric field whereby liquid crystal of a liquid crystal panel that is located above the pixel electrode can be driven and used, where the liquid crystal is allowed to rotate horizontally and also allowed to generate a predetermined longitudinal tilt angle the TFT substrate can be a TFT substrate provided for a traditional IPS array substrate, making it possible to save one mask and associated process, as compared to a traditional FFS array substrate, and thus saving manufacturing cost. The present invention provides an IPS array substrate, which comprises a common electrode located inside a common electrode channel of an insulation protection layer and a pixel electrode located on an upper surface of the insulation protection layer so as to make the common electrode and the pixel electrode stagger with respect to each other in the longitudinal direction, allowing the common electrode and the pixel electrode to generate therebetween a longitudinal component of an electric field so as to improve liquid crystal utilization efficiency and light transmission rate, while the manufacturing process is simple.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. A manufacturing method of an in-plane switching (IPS) array substrate, comprising the following steps:
   Step 1: providing a thin film transistor (TFT) substrate and depositing an insulation protection layer on the TFT substrate;
   Step 2: coating a layer of photoresist material on the insulation protection layer and subjecting the layer of photoresist material to exposure and development by using a half-tone mask so as to form a photoresist layer, wherein the photoresist layer comprises a first channel that completely penetrates through the photoresist layer to expose a part of the insulation protection layer and a second channel that does not penetrate through the photoresist layer and covers on the insulation protection layer;
   Step 3: subjecting the insulation protection layer to etching with the photoresist layer as a shielding layer so as to form a common electrode channel in the insulation protection layer to corresponds to the first channel;
   Step 4: subjecting the photoresist layer to ashing treatment in order to thin the photoresist layer and allow the second channel to penetrate through the photoresist layer to expose a part of the insulation protection layer; and
   Step 5: depositing a conductive layer on the remaining portion of the photoresist layer and the insulation protection layer and peeling off the photoresist layer to remove the photoresist layer and a portion of the conductive layer located on the photoresist layer, with a portion of the conductive layer located in the common electrode channel and corresponding to the first channel preserved to form a common electrode and a portion of the conductive layer located on an upper surface of the insulation protection layer and corresponding to the second channel also preserved to form a pixel electrode.

2. The manufacturing method of the IPS array substrate as claimed in claim 1, wherein in Step 3, the insulation protection layer is subjected to dry etching and an etchant gas used comprises a mixture gas of $CF_4$, $O_2$, $Cl_2$, and He.

3. The manufacturing method of the IPS array substrate as claimed in claim 1, wherein in Step 2, the photoresist material coated on the insulation protection layer comprises a positive resist material, and the half-tone mask comprises a light transmission zone, a partial light transmission zone, and a remaining portion that is a light shielding zone, wherein the first channel corresponds to and is formed with the light transmission zone and the second channel corresponds to and is formed with the partial light transmission zone.

4. The manufacturing method of the IPS array substrate as claimed in claim 1, wherein in Step 1, depositing the insulation protection layer is achieved with chemical vapor deposition and the insulation protection layer comprises a material that comprises silicon nitride, silicon oxide, or a stacked combination of silicon nitride and silicon oxide.

5. The manufacturing method of the IPS array substrate as claimed in claim 1, wherein in Step 5, depositing the conductive layer is achieved with physical vapor deposition and the conductive layer comprises a metal material or a transparent metal oxide material.

6. The manufacturing method of the IPS array substrate as claimed in claim 1, wherein the TFT substrate provided in Step 1 comprises a backing plate, a plurality of gate scan lines and a plurality of data lines formed on the backing plate, and a plurality of pixel units that are arranged in an array and defined by the plurality of gate scan lines and the plurality of data lines crossing each other in a mutually isolated manner;

wherein each of the pixel units comprises a TFT device.

* * * * *